United States Patent [19]
Tanaka et al.

[11] Patent Number: 5,409,055
[45] Date of Patent: Apr. 25, 1995

[54] HEAT PIPE TYPE RADIATION FOR ELECTRONIC APPARATUS

[75] Inventors: Suemi Tanaka; Junji Sotani, both of Yokohama; Kenichi Nanba, Tokyo, all of Japan

[73] Assignee: Furukawa Electric Co., Ltd., Japan

[21] Appl. No.: 35,376

[22] Filed: Mar. 22, 1993

[30] Foreign Application Priority Data

Mar. 31, 1992 [JP] Japan .................................. 4-105382
Feb. 19, 1993 [JP] Japan .................................. 5-054804

[51] Int. Cl.⁶ ............................................. F28D 15/00
[52] U.S. Cl. ........................... 165/104.33; 165/104.26; 361/700
[58] Field of Search ...................... 165/104.33, 104.26; 361/700

[56] References Cited

U.S. PATENT DOCUMENTS

| | | | |
|---|---|---|---|
| 3,476,175 | 11/1969 | Pleuyak | 165/104.33 |
| 4,118,756 | 10/1978 | Nelson et al. | 165/104.33 |
| 4,685,512 | 8/1987 | Edelstein et al. | 361/700 |
| 4,941,530 | 7/1990 | Crowe | 165/104.33 |
| 5,199,165 | 4/1993 | Crawford et al. | 165/104.33 |

FOREIGN PATENT DOCUMENTS

198848 10/1985 Japan .
156557 6/1990 Japan .
12660 1/1992 Japan .

OTHER PUBLICATIONS

"Furukawa Heat Pipe FRHP" Furukawa Electric America, Inc. Peachtree City, Ga., 1992.
Japanese Document, ISBN-4-526-01913-5, pp. 113-116, 1992.

*Primary Examiner*—A. Michael Chambers
*Attorney, Agent, or Firm*—Lorusso & Loud

[57] ABSTRACT

A heat pipe type radiator is formed with a cooling plate mounted on an evaporative section of a heat pipe and a flat heat conductive plate mounted on a condenser section. Heat-generating electronic components are brought into contact with the cooling plate and a radiation fin molded from a thin plate in a wave form is mounted on both surfaces of the heat conductive plate. Other embodiments of the radiation fin include a skived fin formed by skiving a flat plate in an arch form, a pin fin and a wire fin which are composed of and so forth. Since each of these fins has the large surface area for heat radiation per unit volume and is small in weight, it is suitable to use for a heat pipe type radiator for an electronic apparatus. The heat generated in the electronic components transported to the heat conductive plate through the cooling plate and the heat pipe is radiated from the entire surface of the radiation fin to the ambient air. The heat conductive plate is molded in a flat form and, therefore, the heat generated in the electronic components can conduct to the portion most remote from the heat pipe. Further, since the radiation fin has a large surface area for heat radiation per unit volume, the heat radiation capability is improved.

8 Claims, 6 Drawing Sheets

HEAT PIPE TYPE RADIATION FOR ELECTRONIC APPARATUS

BACKGROUND OF THE INVENTION

1. Field of the Invention

This invention relates, to a heat pipe type radiator for cooling heat-generating components.

2. Description of the Prior Art

In recent electronic apparatus, the heat-generating components such as LSI (Large Scale Integrated Circuit) are assembled in high packaging density on printed circuit boards and a large number of these printed circuit boards are inserted into a cabinet with a small spacing. Therefore, the heat generation rate within each electronic apparatus is strikingly increased, and design of the conventional forced-air cooling type radiator having a fan unit has reached its limit of cooling capability. In addition, in recent designs, the space for packaging each heat radiator has become narrower, and the heat radiation within the electronic apparatus has become an extremely difficult problem.

Now, a cooling structure is being used in which a heat pipe is mounted on a heat-generating component and the heat absorbed from that component by an evaporative section of the heat pipe is transported to a condenser section in the heat pipe to radiate the heat. Since heat pipes transport large latent heat by vapor with high speed, the heat pipes transport heat with a slight temperature difference between the evaporative section and the condensive section. In addition, since the heat pipes show excellent heat transfer performance, a heat pipe type radiator has been widely used to cool semiconductor elements such as LSI.

FIG. 10 is a schematic perspective view showing a conventional heat pipe type radiator. In this radiator, the heat-generating components such as a LSI 3 mounted on a printed circuit board 2 are brought into contact with the evaporative section (heating section) of a heat pipe 1 directly or through a transportation plate 4, radiation fins 5 of a plate type are directly mounted on the condenser section (cooling section) of the heat pipe 1. The generated heat in the LSI 3 is transported to ambient air through the plate fins 5. The structure of the heat radiation members on the condenser section of the heat pipe 1, may be the plate type shown in FIG. 10 or a type in which the fin and a heat conductive plate are one piece formed of extruded aluminum as shown in FIG. 11.

In order to improve the performance of electronic apparatus, however, the electronic components tend to be mounted in high density onto each printed circuit board, and simultaneously the spacing between adjacent printed circuit boards tends to become smaller due to insertion of more printed circuit boards into a cabinet. Accordingly, the heat generating problem has tended to worsen in recent years.

Therefore, the conventional mounting of the fins on heat-generating components encounters difficulty in dealing with the heat radiation from the conventional heat pipe radiator as described above.

For example, in the cooling section of the heat radiator shown in FIG. 10, dimensions a, b and c are determined by the size of the printed circuit boards 2, the spacing between the printed circuit boards 2 and the size of the cabinet, respectively, and therefore, the higher the density in mounting, the smaller the heat radiation space becomes. However, there are limitations on improvements of the heat radiation capability. For instance, with respect to the radiator shown in FIG. 10, the heat transported through the heat pipe 1 does not sufficiently conduct to the remote part Y located furthest from the heat pipe 1. Further, with respect to the radiator shown in FIG. 11, the heat radiation member 6 as a whole provides closer to a uniform temperature distribution, but the surface area for heat radiation is small. Thus, development of the heat radiation capability remains limited.

SUMMARY OF THE INVENTION

It is accordingly an object of the present invention to improve the heat radiation capability of a heat pipe type radiator and to miniaturize the radiator.

According to the present invention, a heat pipe type radiator for an electronic apparatus, which absorbs heat of heat-generating electronic components through an evaporative section of a heat pipe and radiates the absorbed heat through a heat radiation member mounted on a condenser section of the heat pipe, is characterized in that the heat radiation member is composed of a heat conductive plate mounted on the condenser section of the heat pipe, and a radiation fin.

BRIEF DESCRIPTION OF THE DRAWINGS

The foregoing and other objects and features of the invention will become apparent from the following description of preferred embodiments of the invention with reference to the accompanying drawings, in which.

DETAILED DESCRIPTION OF THE PREFERRED EMBODIMENTS

Figure 1:
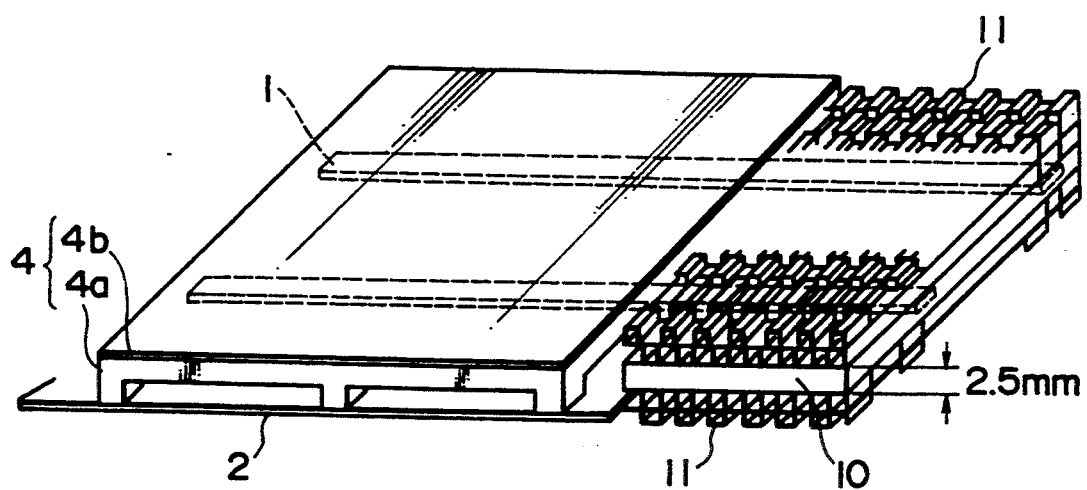
FIG. 1 is a schematic perspective view showing a heat pipe type radiator as a preferred embodiment of the present invention.
Figure 2:
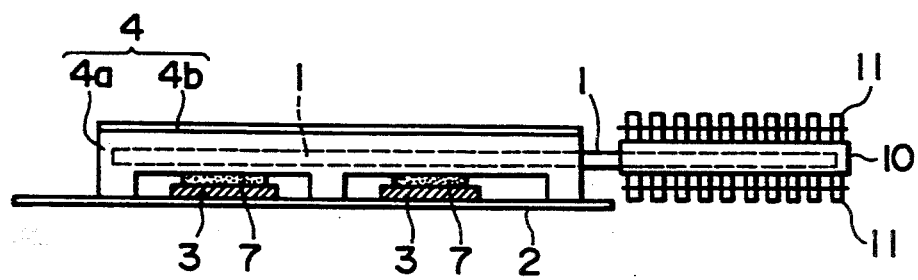
FIG. 2 is a schematic side view showing the heat pipe type radiator of FIG. 1.
Figure 10:
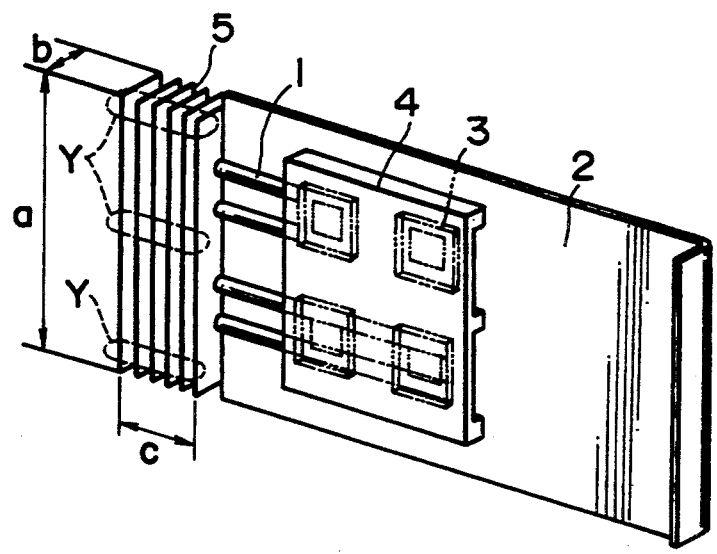
FIG. 10 is a schematic perspective view showing a heat pipe type radiator of the prior art.

FIGS. 1 and 2 are, respectively, a schematic perspective view and a schematic side view showing a heat pipe type radiator for an electronic apparatus as a preferred embodiment of the present invention. In explaining these drawings, the same parts as those illustrated in FIG. 10 are indicated by like reference numerals.

The heat pipe type radiator shown in this preferred embodiment has a structure in which a cooling plate 4 is mounted on each evaporative section (heating section) of two pieces of flat heat pipes 1, a heat conductive plate 10 is attached to each condenser section (cooling section) and radiation fins 11 are mounted on the front and back surfaces of the heat conductive plate 10. The cooling plate 4 is composed of a main body 4a and a cover body 4b. The evaporative section of the heat pipe 1 is fixed within the grooved portion provided on the surface of the main body 4a, and the cover body 4b covers the main body 4a and is fixed to a printed circuit board 2. The cover body 4b is fixed to the main body 4a so that a LSI 3 mounted on the printed circuit board 2 may be brought into contact with the back surface of the main body 4a through a highly heat conductive rubber 7.

The heat conductive plate 10 has a structure in the form of flat plate with a thickness of 2.5 mm, which is made by bonding two aluminum plates to each other, and the condenser section of the heat pipe 1 is arranged to be fixed within the grooved portion provided on one or beth of the bonded plates. The heat conductive plate 10 is installed so as to be removable from the cabinet when inserting the printed circuit board 2 into the cabinet.

Figure 3:
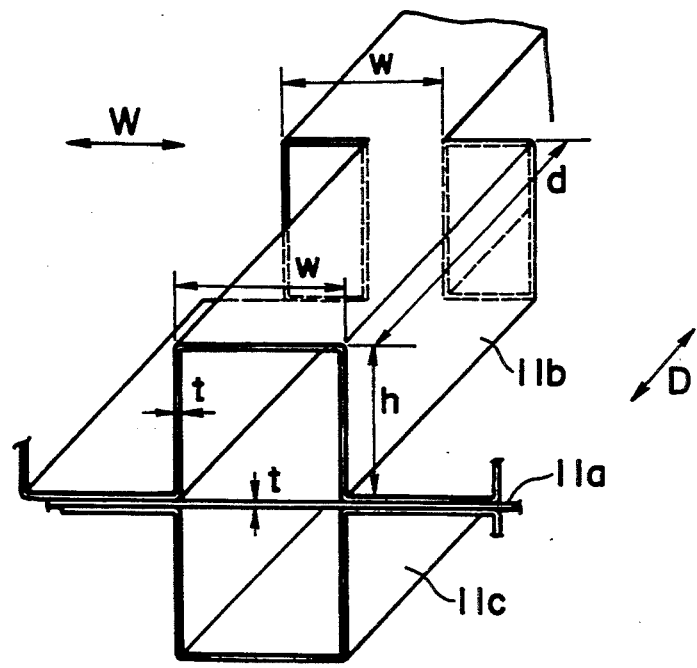
FIG. 3 is a schematic view showing a radiation fin of a heat pipe type radiator as a preferred embodiment of the present invention.

The radiation fins 11 fixed to the front and back surfaces of the heat conductive plate 10 by means of soldering are made of aluminum and have a structure in which fin members 11b and 11c having the same rectangular wave shape are attached to both surfaces of a flat fin member 11a with a thickness of 0.1 mm by brazing, as shown in FIG. 3. Thus, a heat radiation member is constituted by the heat conductive plate 10 and the radiation fins 11.

The fin members 11b and 11c are aluminum plates each with a thickness (t) of 0.3 mm pressed into rectangular wave-form shapes, each with a width (w) of 2 mm and a height (h) of 2 mm and the phases of the resultant plates in a width direction W are shifted every distance (d) of 4 mm. The fin members 11b and 11c are provided so that the width direction W corresponds to the longitudinal direction of the heat pipe 1. A fan unit (not shown) is provided so that cooling air may be blown in the direction D of the fin members 11b and 11c.

Furthermore, copper, aluminum and the alloys thereof or like materials with good heat conductivity can be used for the heat pipe, the heat conductive plate and the radiation fin.

The overall operation is as follows. The heat generated in the LSI 3 conducts to the cooling plate 4 through the highly heat conductive rubber 7 and heats the evaporative section of the heat pipe 1. Then, the conducted heat warms up and evaporates fluid sealed in the heat pipe. The vapor pressure within the space of the evaporative section of the heat pipe 1 is thereby raised to produce a vapor stream which moves toward the condenser section having a lower pressure. The heat of the vapor transported to the condenser section conducts to the flat heat conductive plate 10 and is radiated to ambient air through the entire surface of the radiation fins 11 mounted on the heat conductive plate 10.

Since, the heat conductive plate 10 can transport and radiate the heat through the condenser section of the heat pipe 1 to portions located remote from the heat pipe 1, the heat conductive plate 10 as a whole comes closer to providing almost uniform temperature distribution. The radiation fin 11 mounted on the heat conductive plate 10 has double or more the surface area per unit volume in comparison with that of a conventional fin member. Further, the distance between the heat conductive plate 10 and the fin member is shorter than that in case of the conventional fin member, even though the fin member 11b may be a laminate of three layers. Therefore, no large temperature drop is produced even at that portion most remote from the heat conductive plate 10 and the heat conductive plate 10 as a whole comes closer to providing almost uniform temperature distribution, so that the heat radiation capability is improved for each increment of the surface area of the radiation fin.

Therefore, the heat transported through the condenser section of the heat pipe 1 can uniformly conduct to the whole of the heat conductive plate 10 and the radiation fin 11, that is, the whole of the heat radiation member. Since the radiation fins 11 with a large surface area as a whole give a sufficient heat radiation effect, the heat pipe type radiator according to the present invention possesses excellent heat radiation capability. In addition, since the fin menders 11b and 11c are shifted from each other by a half pitch at a certain interval, cooling air generates eddies, so that the heat radiation capability is improved much more than by an incremental increase of the surface area of the radiation fin.

Figure 4:
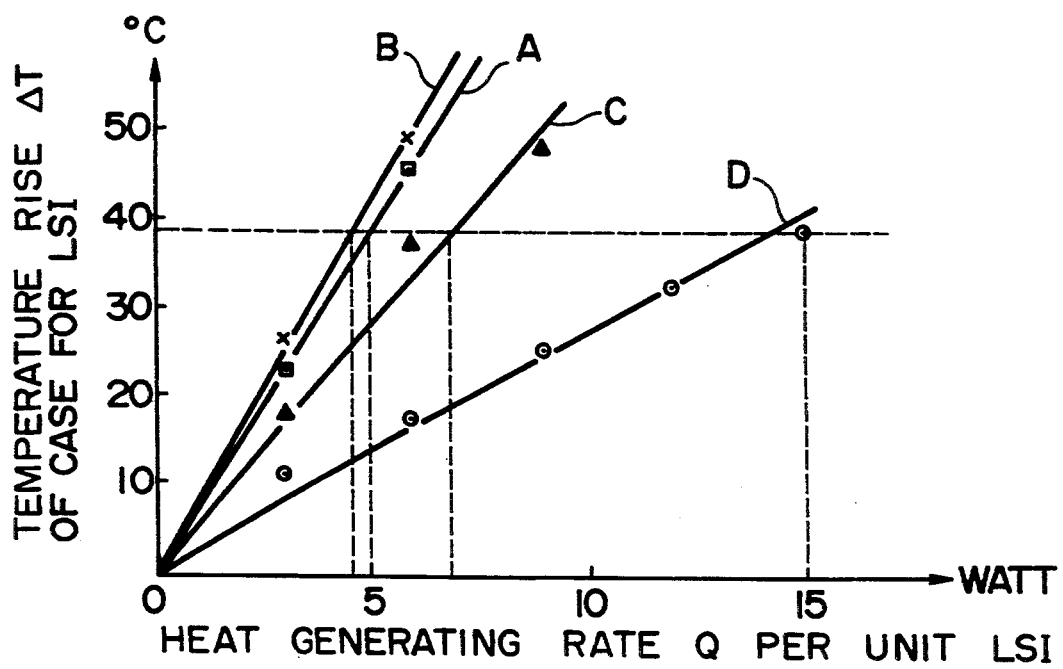
FIG. 4 is a characteristic graph comparing the capabilities of various heat pipe type radiators with one another.

FIG. 4 is a graph showing a comparison in capability between a prior art heat pipe type radiator and a heat pipe type radiator of the present invention. In the drawing, the abscissa represents heat generating rate Q (watt) per unit LSI and the ordinate represents the temperature rise $\Delta T(°C.)$ of the LSI.

Figure 11:
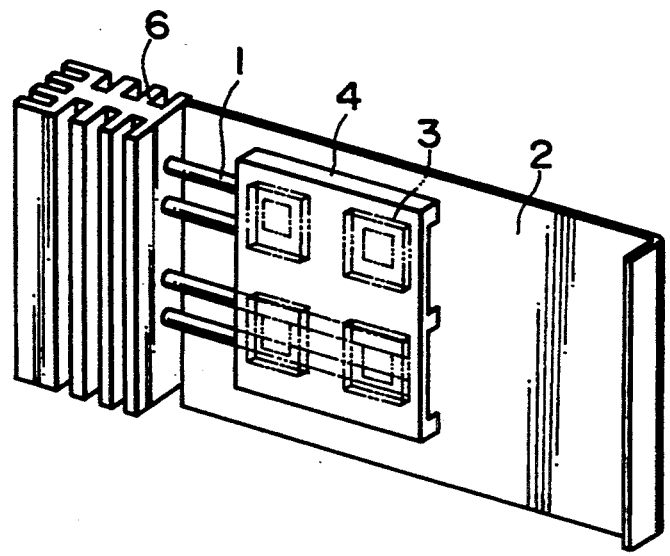
FIG. 11 is a schematic perspective view showing another heat pipe type radiator of the prior art.

In the drawing, lines A, B, C and D show the capability of a prior art heat pipe type radiator A (FIG. 10) having a plate radiation fin 5 mounted on the heat pipe 1, the capability of a prior art heat pipe type radiator B (FIG. 11) having a heat radiation member 6 provided with the fin and the heat conductive plate as a unitary molding and mounted on the heat pipe 1, the capability of a heat pipe type radiator C having the radiation fin 11 molded in a rectangular wave form and directly mounted on the heat pipe 1 by brazing, and the capability of heat pipe type radiator D (FIG. 1) having the heat radiation member of the present invention including the flat heat conductive plate 10 and the rectangular waveform radiation fin 11 and mounted on the heat pipe 1, respectively.

Moreover, the exact same structure is provided on the side of the printed circuit board 2 of each heat pipe type radiator, such that four pieces LSIs, each having a heat generating rate of 15 watts, are mounted on the printed circuit board 2 and the cooling plate 4 is mounted on the printed circuit board 2 by use of nine screws. In addition, the heat radiation surface of the radiation fin in each heat radiation member is equal and two flat heat pipes 1 of 1.5 mm×5 mm in size are used. The spacing between the printed circuit boards 2 is set to be 10 mm and the air velocity striking the heat radiation member is set constant at 3 m/sec.

In general, the maximum permissible temperature of the LSI is limited, and with the LSI used at this time, the temperature cannot be permitted to rise above 40° C. Therefore, it is evident from FIG. 4 that the permissible heat generating rate of LSI becomes 4.7 watts for the heat pipe type radiator A, 5 watts for the heat pipe type radiator B, 7 watts for the heat pipe type radiator C and 15 watts for the heat pipe type radiator D, respectively. Incidentally, with the spacing between the printed circuit boards used in this embodiment, without using any heat pipe, the permissible heat generating rate is only 2 watts.

When the heat conductive plate 10 is omitted from the present invention and the radiation fin 11 is mounted directly on the heat pipe 1, as shown in the heat pipe type radiator C, the surface area for heat radiation becomes large. However, the radiation fin 11 itself produces a large temperature distribution and, the heat radiation capability of the radiation fin in the neighborhood of the end and the portion located remote from the heat pipe almost disappears. It is also found thereby that the heat radiation capability is largely improved by the heat pipe type radiator D in accordance with the present invention.

Figure 5A:
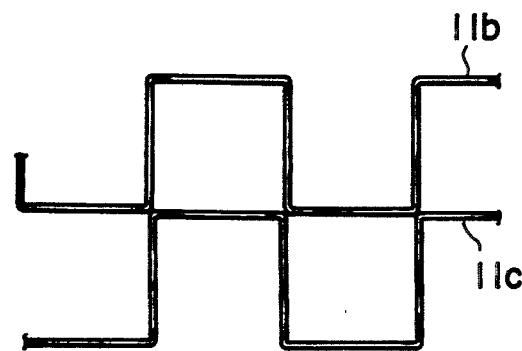
FIGS. 5a and 5b are cross-sectional views showing radiation fins of a heat pipe type radiator as another preferred embodiment of the present invention.
Figure 5B:
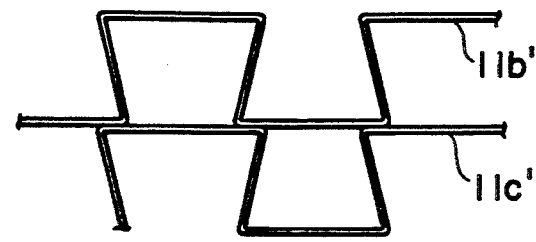

In the preferred embodiment shown in FIG. 5(a), the flat fin member 11a is omitted and the rectangular wave-formed fin members 11b and 11c constitute the radiation fin 11. In the preferred embodiment shown in FIG. 5(b), the fin members 11b and 11c are transformed into trapezoid fin members 11b' and 11c' and these fin members 11b' and 11c' are stacked to form the radiation fin 11. Since the flat fin member 11a (FIG. 3) is designed to facilitate the assembly of the radiation fin 11, the flat fin member 11a may be omitted as shown in the preferred embodiments of FIGS. 5a and 5b, and the rectangular wave-form or trapezoid fin members may be directly stacked to form the radiation fin 11. Incidentally, where space does not permit stacking the fin members in a plurality of stages, it may be sufficient to mount only a single fin member molded in a wave form.

Figure 6:
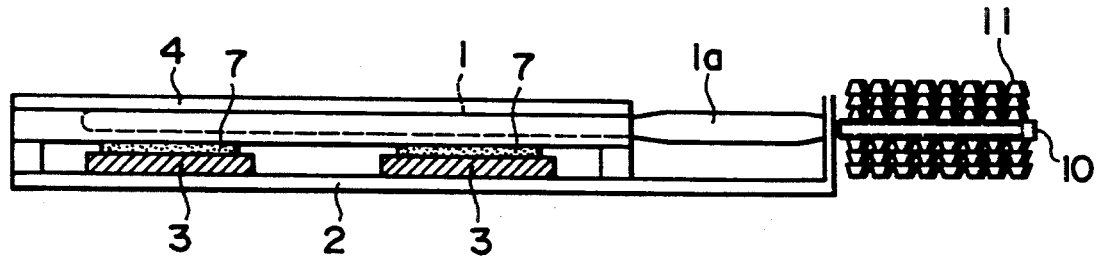
FIG. 6 is a schematic side view showing a heat pipe type radiator as a further preferred embodiment of the present invention.

FIG. 6 is a schematic view showing a heat pipe type radiator for an electronic apparatus as another preferred embodiment of the present invention. This preferred embodiment is characterized in that each of the evaporative section and the condenser section of the heat pipe I has a flat cross section and the intermediate section 1a between the evaporative section and the condenser section has a circular cross section.

With reference to the heat pipe, the heat pipe of the present invention possesses sufficient capability even where it has a roughly circular cross section over its entire length, which has been often used. However, the evaporative section preferably has a flat cross section due to the limitation of space, i.e., the spacing between the circuit boards, and for the purpose of the improvement of heating capability. The condenser section also preferably has a flat cross section, since the optimum value of the thickness of the heat conductive plate 10 is normally a thin portion of the heat conductive plate, which is hard to generalize as a rule, due to the fact that the thickness of the heat conductive plate 10 is determined by the mounting position of the heat pipe 1 and the space occupied by the radiation fin 11.

In addition, the aspect ratio in the sectional shape of the condenser section is large in comparison with the aspect ratio in the sectional shape of the evaporative section, and the sectional, area in the direction perpendicular to the direction of the cooling air flow is small. Therefore, the fin area within the same space may be, accordingly, increased, and further the pressure drop in the air pressure is reduced to improve the heat radiation capability. Furthermore, the heat transportation value becomes maximum when the heat pipe is circular in cross section. Therefore, the intermediate portion 1a is made circular in cross section so as to maximize the capability of the heat pipe 1.

Figure 7:
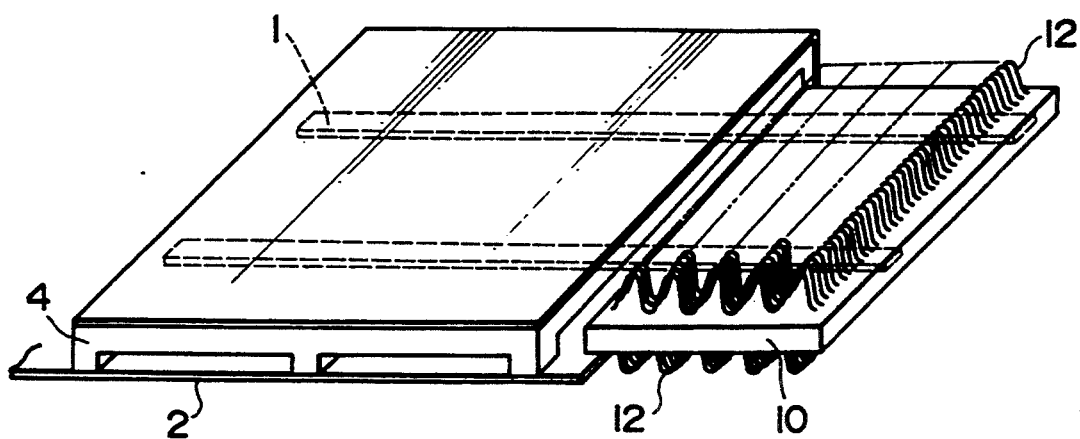
FIG. 7 is a schematic perspective view showing a heat pipe type radiator as a still further preferred embodiment of the present invention.
Figure 8:
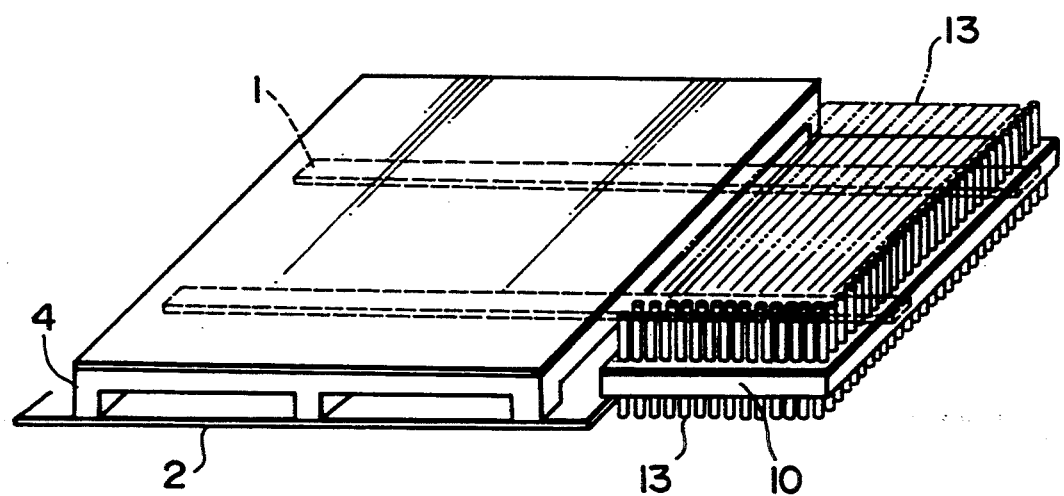
FIG. 8 is a schematic perspective view showing a heat pipe type radiator as a yet further preferred embodiment of the present invention.
Figure 9:
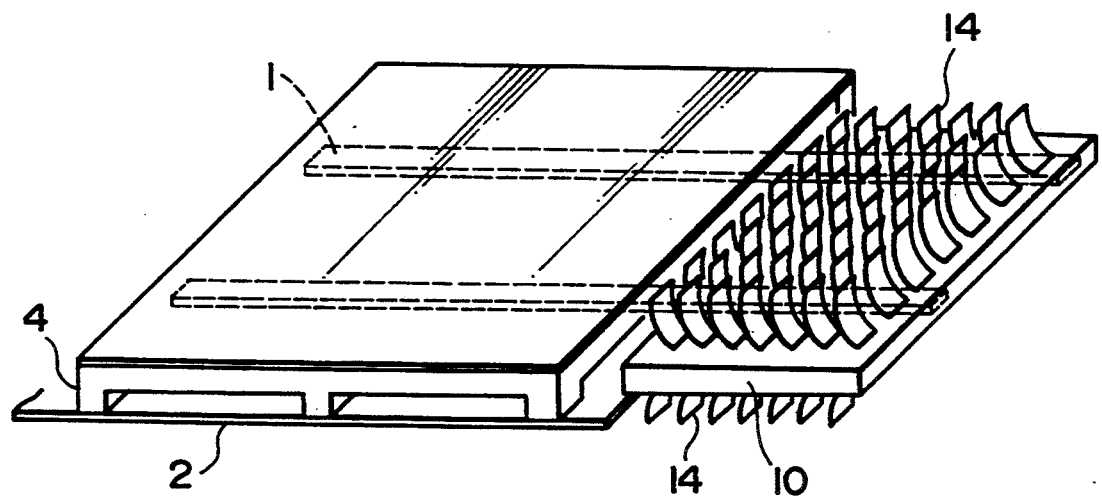
FIG. 9 is a schematic perspective view showing a heat pipe type radiator as a yet further preferred embodiment of the present invention.

FIGS. 7 and 8 and 9 are schematic perspective views showing heat pipe type radiators for an electronic apparatus as third, fourth and fifth preferred embodiments of the present invention, respectively. In particular, other embodiments of radiation fins are shown.

In these preferred embodiments, the heat pipe type radiator shown in FIG. 7 is composed of a wire fin 12 formed of a large number of wire rods in a sine wave form, which together serve as the radiation fin 11 mounted on the heat conductive plate 10. Even in this constitution, it is possible to provide a heat radiation member which has a large surface area for heat radiation per unit volume and is small in weight and also excellent in heat radiation capability.

The heat pipe type radiator shown in FIG. 8 is composed of a pin fin 13 formed of a large number of upright pin-like wire rods, which together constitute the radiation fin 11 mounted on the heat conductive plate 10, The heat pipe type radiator shown in FIG. 9 is composed of a skived fin 14 formed by skiving a large number of plates in an arch form as the radiation fin 11 mounted on the heat conductive plate 10. Even in these forms, it is possible to provide a heat radiator member which has the large surface area for heat radiation per unit volume and is small in weight and also excellent in heat radiation capability.

Moreover, in each preferred embodiment described above, the radiation fin is mounted so that the wave direction of the fin member corresponds to the longitudinal direction of the heat pipe. However, it may be good to mount the radiation fin perpendicular to the longitudinal direction of the heat pipe. The fin member, which has a rectangular wave form in a preferred embodiment described above, is used as the fin member formed by molding thin plates into a wave form, but there is no limitation to this fin member. For example, a fin member in a sine wave form may also be used. With respect-to the heat conductive plate, a halved type is used in the preferred embodiment described above, but there is no limitation to this halved type.

Furthermore, in each preferred embodiment described above, the fin members are mounted on both sides of the heat conductive plate However, there is no limitation to such a structure. Namely, the fin member may be mounted on only one side of the heat conductive plat. In this manner, a further space saving will be possible. Moreover, there is no particular limitation in the preferred embodiments described above in terms of the combinations between various kinds of fin members and heat pipes in the present invention, but an appropriate determination will be made depending space and required capability of each heat pipe radiator.

What is claimed is:

1. A heat pipe type radiator for cooling an electronic apparatus comprising:
   a heat pipe, said heat pipe comprising:
   a flat evaporator pipe section, having a flattened outer circumferential surface, for adsorbing heat from electronic components of the electronic apparatus;
   a flat condenser pipe section, having a flattened outer circumferential surface, for radiating the adsorbed heat to ambient atmosphere;
   an intermediate pipe section, connecting said evaporator pipe section with said condenser pipe section, said intermediate section having a round cross-section;

a heat conductive plate fixed to and supported by said outer circumferential surface of said condenser pipe section; and at least one heat radiating fin mounted on said heat conductive plate.

2. A heat pipe type radiator for an electronic apparatus according to claim 1, wherein said condenser pipe section has an aspect ratio larger than that of the sectional shape of said evaporative section.

3. A heat pipe type radiator for an electronic apparatus according to claim 1, wherein said radiation fin is a fin member molded from a thin plate.

4. A heat pipe type radiator for an electronic apparatus according to claim 3, wherein said radiation fin is a fin member molded in a wave form.

5. A heat pipe type radiator in accordance with claim 1 further comprising a fluid contained within said heat pipe, said fluid vaporizing in said evaporative section and condensing in said condenser section.

6. A heat pipe type radiator for cooling an electronic apparatus according to claim 1 wherein said evaporator pipe section, said condenser pipe section and said intermediate pipe section are joined along a common axis.

7. A heat pipe type radiator for cooling an electronic apparatus according to claim 6 wherein said common axis is a straight line and said evaporator pipe section, said condenser pipe section and said intermediate pipe section are axially aligned along said common axis.

8. The heat pipe type radiator for cooling electronic apparatus according to claim 1 further comprising a cooling plate fixed to and supported by said outer circumferential surface of said evaporator pipe section.

* * * * *